(12) United States Patent
Kim et al.

(10) Patent No.: US 7,439,150 B2
(45) Date of Patent: Oct. 21, 2008

(54) METHOD OF MANUFACTURING A SEMICONDUCTOR DEVICE

(75) Inventors: Shin-Hye Kim, Gyeonggi-do (KR); Ju-Bum Lee, Gyeonggi-do (KR); Min Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 146 days.

(21) Appl. No.: 11/245,367

(22) Filed: Oct. 5, 2005

(65) Prior Publication Data

US 2006/0073669 A1    Apr. 6, 2006

(30) Foreign Application Priority Data

Oct. 6, 2004    (KR)    .................... 10-2004-0079614

(51) Int. Cl.
*H01L 21/20*    (2006.01)
(52) U.S. Cl. ............... 438/387; 438/386; 438/382; 438/389
(58) Field of Classification Search ........... 438/694, 438/253, 396, 681, 200, 243, 392, 239, 254, 438/397, 399, 640, 726, 978; 365/103, 149, 365/150; 257/301; 437/60
See application file for complete search history.

(56) References Cited

U.S. PATENT DOCUMENTS

| | | | | |
|---|---|---|---|---|
| 5,280,444 A * | 1/1994 | Motonami et al. | .......... | 365/149 |
| 5,688,713 A * | 11/1997 | Linliu et al. | ............... | 438/253 |
| 6,124,162 A * | 9/2000 | Lin | ............... | 438/238 |
| 6,228,736 B1 * | 5/2001 | Lee et al. | ............... | 438/396 |
| 6,235,576 B1 * | 5/2001 | Hong et al. | ............... | 438/253 |
| 6,387,752 B1 * | 5/2002 | Sakao | ............... | 438/253 |
| 6,423,608 B1 * | 7/2002 | Kim | ............... | 438/396 |
| 6,451,663 B1 * | 9/2002 | Choi et al. | ............... | 438/386 |
| 2002/0127866 A1 * | 9/2002 | Kwean et al. | ............... | 438/694 |

(Continued)

FOREIGN PATENT DOCUMENTS

JP    11-354747    12/1999

(Continued)

OTHER PUBLICATIONS

English language abstract of Japanese Publication No. 11-354747.

(Continued)

*Primary Examiner*—Zandra Smith
*Assistant Examiner*—Telly D Green
(74) *Attorney, Agent, or Firm*—Marger Johnson & McCollom, P.C.

(57) ABSTRACT

In one embodiment, to fabricate a semiconductor device, a first insulation interlayer is formed on a substrate. A contact pad is formed through the first insulation interlayer. An etch stop layer and a second insulation interlayer are sequentially formed on the first insulation interlayer and the pad. A contact hole exposing at least a portion of the contact pad is formed by partially etching the second insulation interlayer and the etch stop layer. A preliminary lower electrode is formed in the hole. The preliminary lower electrode is isotropically etched to form a lower electrode contacting the contact pad. A dielectric layer and an upper electrode are sequentially formed on the lower electrode.

20 Claims, 12 Drawing Sheets

U.S. PATENT DOCUMENTS

2002/0160559 A1* 10/2002 Lee et al. .................... 438/200
2002/0179949 A1* 12/2002 Sakao ........................ 257/296
2003/0219942 A1* 11/2003 Choi et al. ................. 438/253
2003/0227044 A1* 12/2003 Park .......................... 257/301

FOREIGN PATENT DOCUMENTS

| KR | 10-2000-0027683 | * | 5/2000 |
| KR | 2001-54265 | | 7/2001 |
| KR | 2002-00349 | | 1/2002 |
| KR | 10-2002-0014489 | * | 2/2002 |

OTHER PUBLICATIONS

English language abstract of Korean Publication No. 2001-54265.
English language abstract of Korean Publication No. 2002-00349.

* cited by examiner

METHOD OF MANUFACTURING A SEMICONDUCTOR DEVICE

CROSS REFERENCE TO RELATED APPLICATION

This application claims priority under 35 USC § 119 to Korean Patent Application No. 2004-79614 filed on Oct. 6, 2004, the disclosure of which is herein incorporated by reference in its entirety.

BACKGROUND OF THE INVENTION

1. Field of the Invention

Example embodiments of the present invention relate to methods of manufacturing semiconductor devices. More particularly, the present invention relates to methods of manufacturing cell capacitors of dynamic random access memory devices.

2. Description of the Related Art

The capacitor area available for storing data shrinks, as the integration of dynamic random access memory (DRAM) that includes a capacitor increases. Recently, the DRAM has operated with a relatively low voltage. In addition, since the DRAM still employs a data sensing method, the capacitor included in the DRAM has to be above about 25 femtofarads (fF) to about 30 fF. However, capacitance above this range becomes difficult to achieve as the integration of the DRAM increases.

In general, when the area of the lower electrode decreases, the capacitance of the capacitor decreases. Thus, in order to overcome disadvantages due to the tendency of the capacitance to decrease, the height of the lower electrode may be varied. In addition, a dielectric layer having a substantially high dielectric constant may be employed in the capacitor.

Recently, cylindrical capacitors have been widely used to increase the capacitance of the capacitor. The cylindrical capacitor includes a lower electrode and a capacitor contact pad. The capacitor contact pad electrically contacts the lower electrode. However, since a design rule of the DRAM device has decreased, the capacitor contact pad may not easily contact the lower electrode.

FIGS. 1A to 1F are cross-sectional views illustrating a method of manufacturing a conventional DRAM capacitor.

Figure 1A:
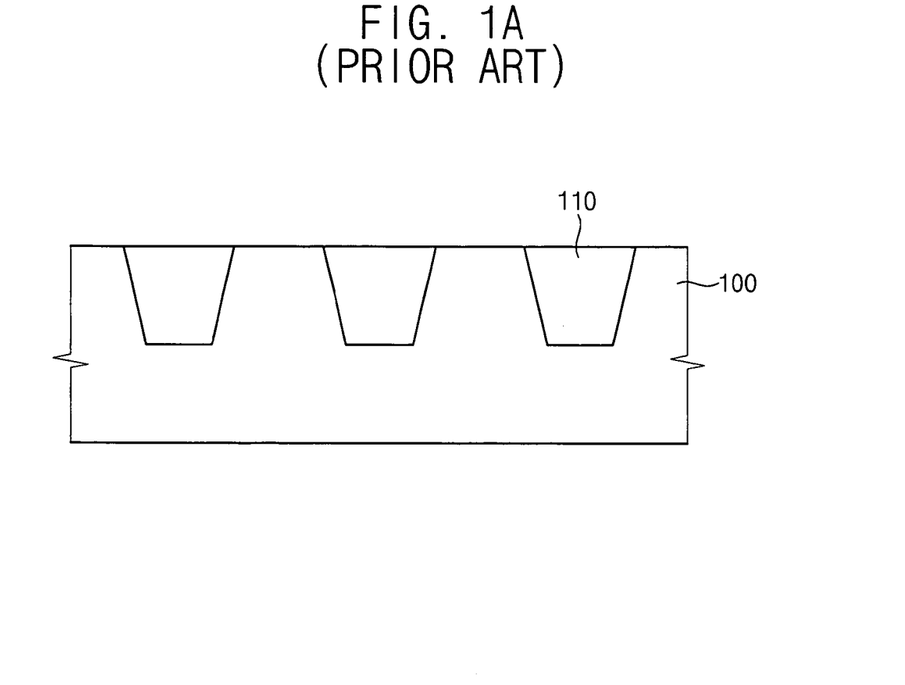
FIGS. 1A to 1F are cross-sectional views illustrating a method of manufacturing a conventional DRAM capacitor.
Figure 1B:
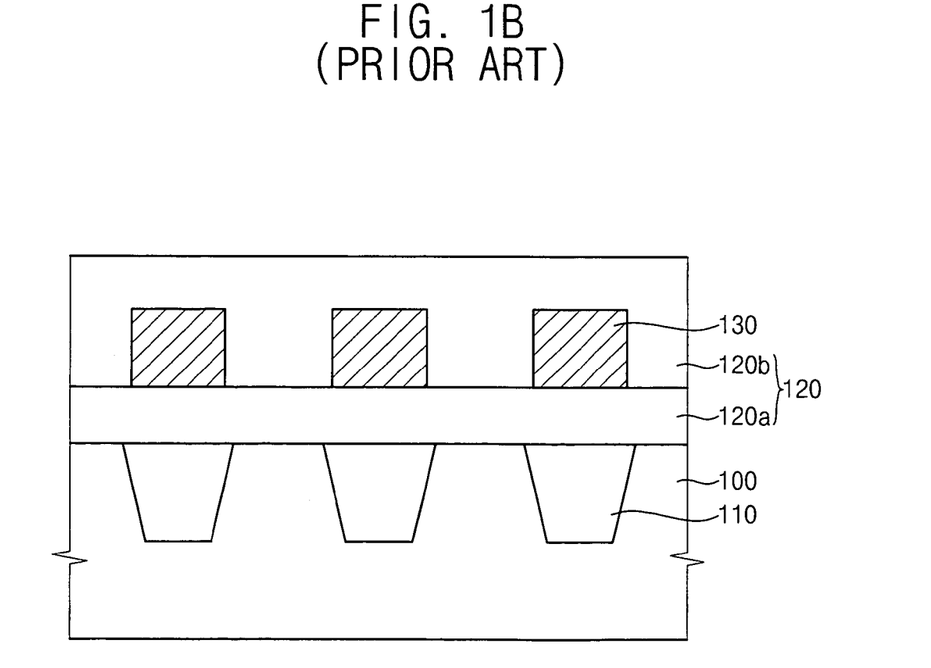

Referring to FIGS. 1A to 1B, a semiconductor substrate includes an active region 100 and a field region 110. A first lower insulation interlayer 120a is formed on the active region 100 and the field region 110. A bit line 130 is then formed on the first lower insulation interlayer 120a.

Figure 1C:
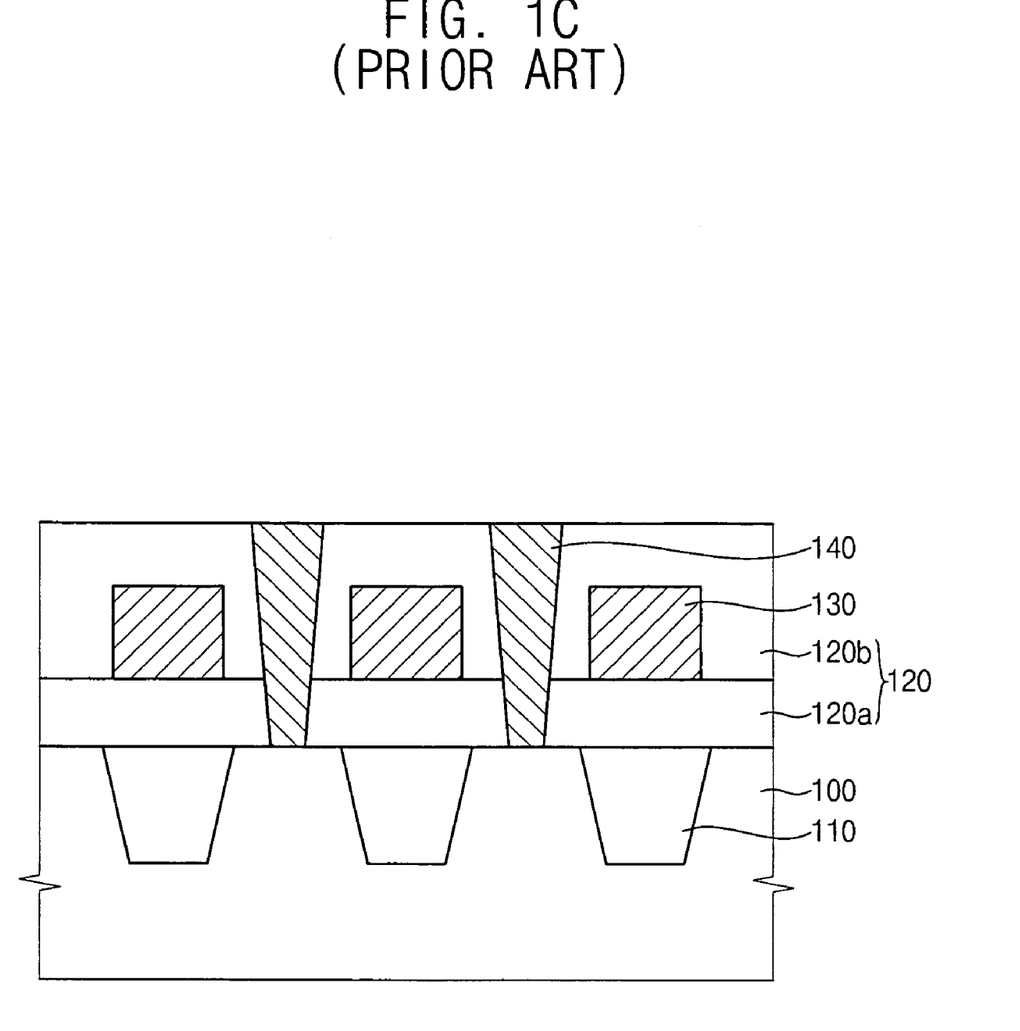

Referring to FIG. 1C, a first upper insulation interlayer 120b is formed on the first lower insulation interlayer 120a to cover the bit line 130. The first lower insulation interlayer 120a and the first upper insulation interlayer 120b are included in a first insulation interlayer 120. A contact pad 140 is formed through the first lower insulation interlayer 120a and the first upper insulation interlayer 120b.

Figure 1D:
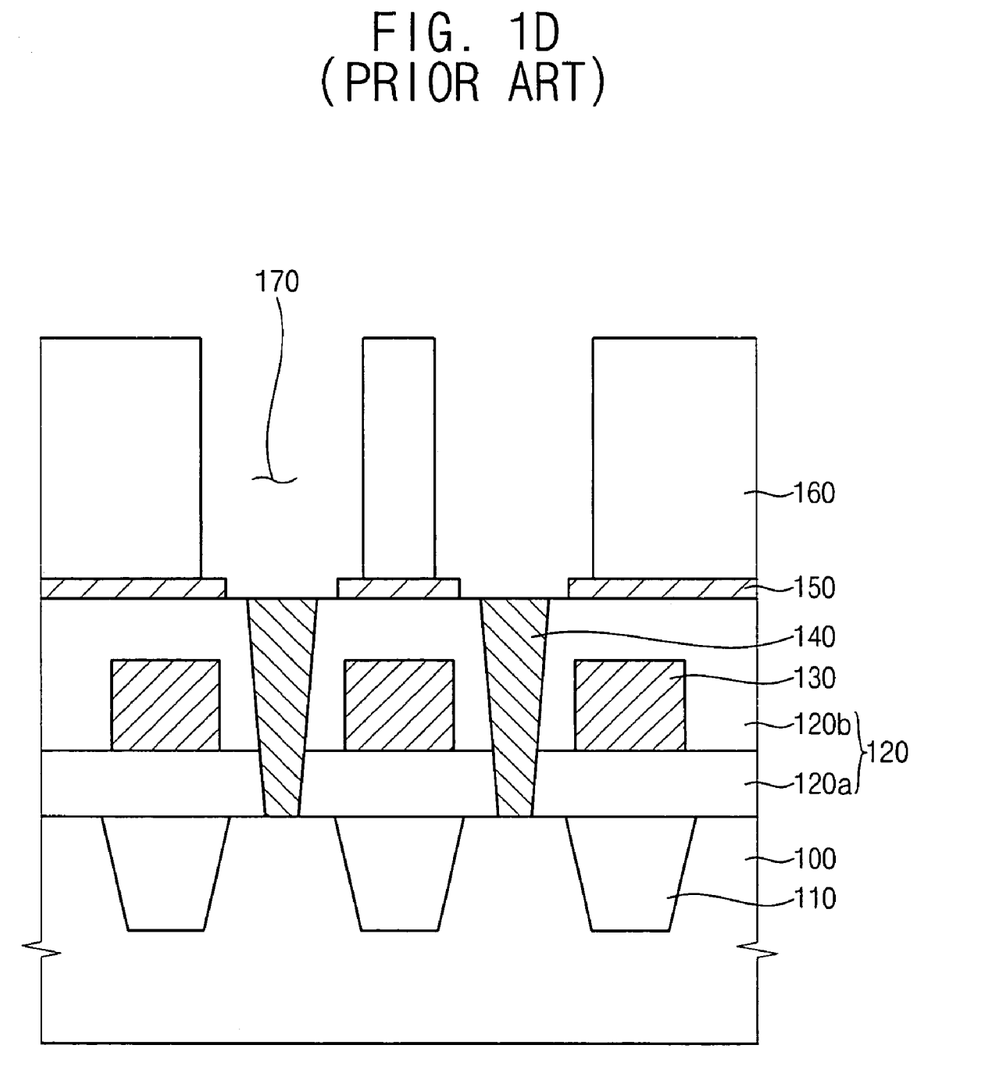

Referring to FIG. 1D, an etch stop layer 150 is formed on the first insulation interlayer 120. The etching stop layer 150 may have an etch rate substantially different from that of a second insulation interlayer 160 to be formed thereon. In general, the etch stop layer 150 may include silicon nitride. The second insulation interlayer 160 is then formed on the etch stop layer 150. Thereafter, a photolithography process is performed on the second insulation interlayer 160 and the etch stop layer 150 so that an electrode hole 170 is formed through the second insulation interlayer 160 and the etch stop layer 150. Since an etch rate of the etch stop layer 150 is substantially different from that of the second insulation interlayer 160, a lower portion of the electrode hole 170 may be substantially small.

Figure 1E:
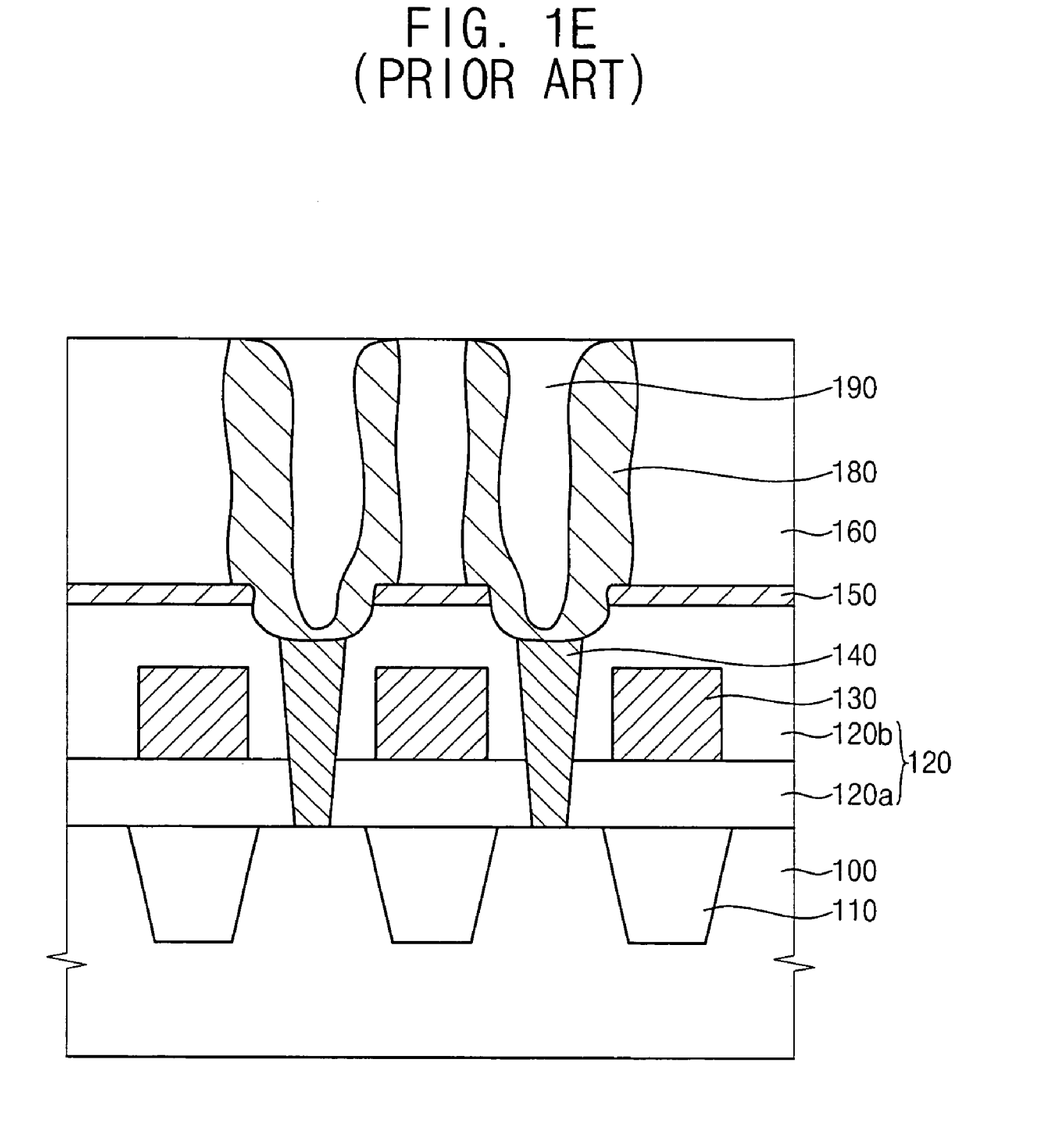
Figure 1F:
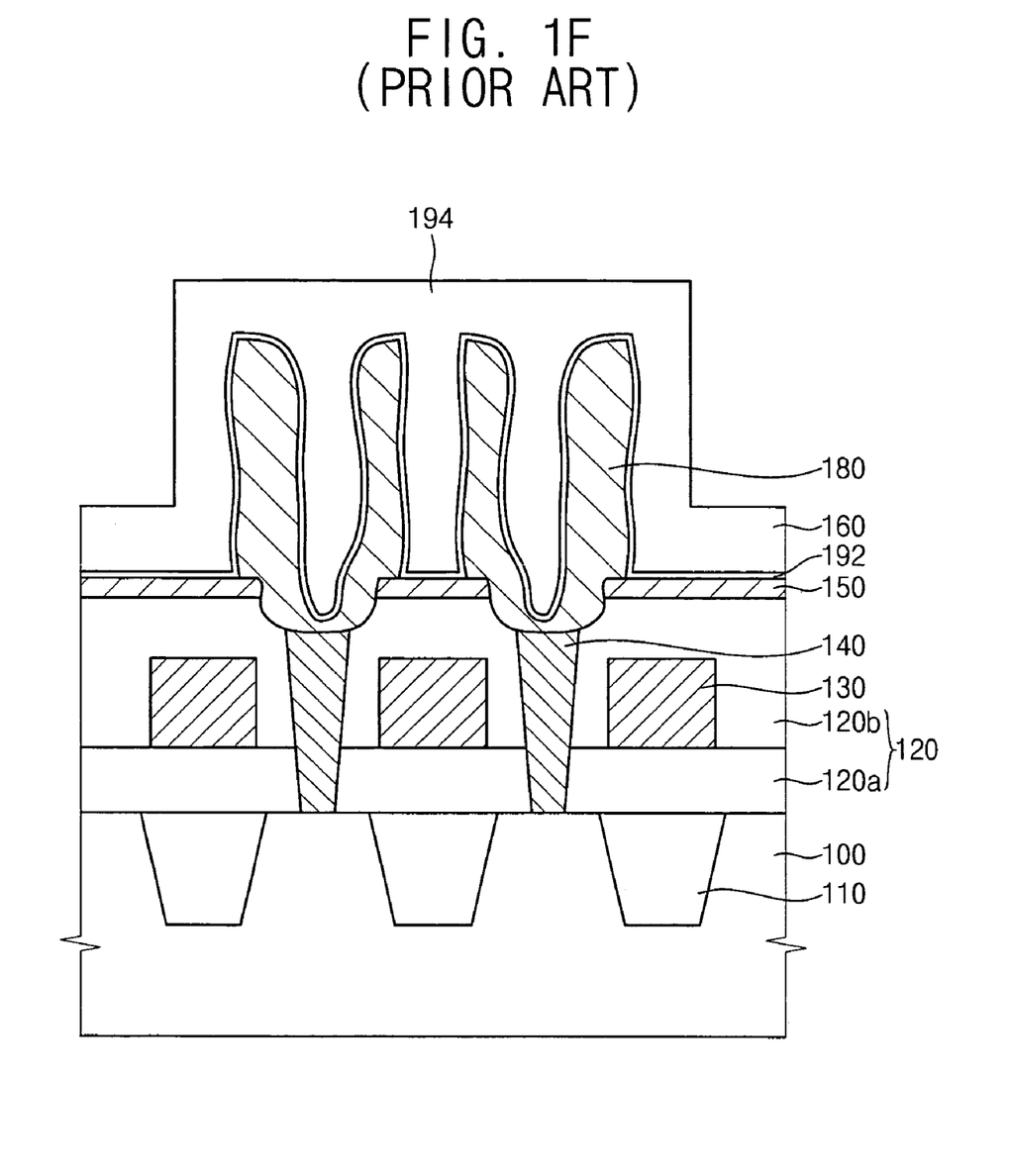

Referring to FIGS. 1E and 1F, a lower electrode layer (not shown) is uniformly formed on an upper face of the second insulation interlayer 160 and an inner face of the electrode hole 170. A sacrificial layer (not shown) is then formed on the lower electrode layer so that the electrode hole 170 partially filled with the lower electrode layer may be fully filled with the sacrificial layer.

Thereafter, a polishing process such as a chemical mechanical polishing process is performed on the sacrificial layer and the lower electrode layer until the second insulation interlayer 160 is exposed. Thus, a lower electrode 180 and a sacrificial layer pattern 190 may be formed in the electrode hole 170. The sacrificial layer pattern 190 and the second insulation interlayer 160 are then removed.

Subsequently, a dielectric layer 192 and an upper electrode 194 are formed on the lower electrode 180. Since the lower portion of the lower electrode hole 170 is substantially narrow, an inner diameter of a lower portion of the lower electrode 180 may be substantially small. In addition, a thickness of the lower electrode 180 may be irregular. Thus, the dielectric layer 192 and the upper electrode may not efficiently cover an inner surface of the lower electrode 180.

Figure 2:
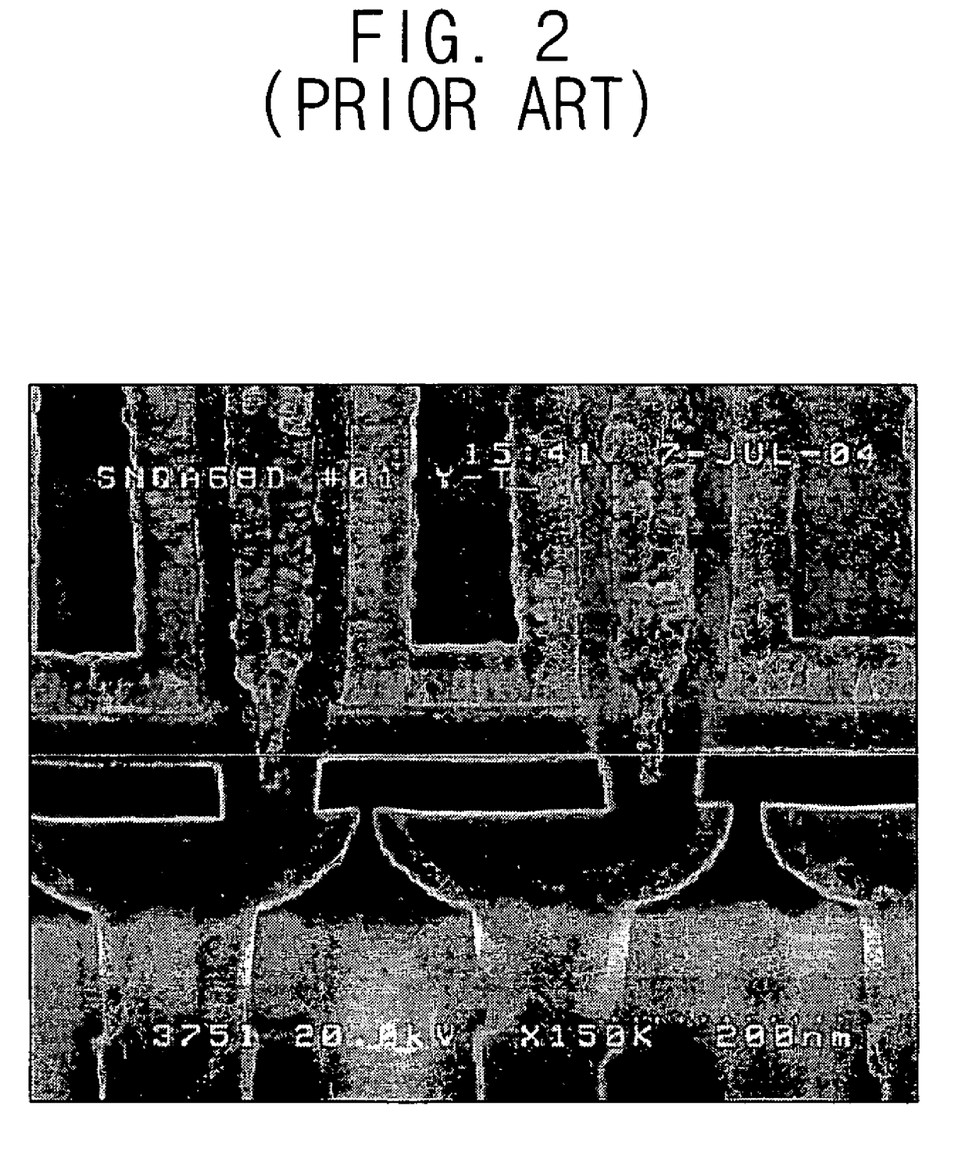
FIG. 2 is an SEM picture illustrating the conventional cylindrical capacitor shown in FIG. 1F.

FIG. 2 is an SEM picture illustrating the conventional cylindrical capacitor in FIG. 1F. Referring to FIG. 2, a lower portion of a lower electrode has a substantially small inner diameter because an etch stop layer has an etch rate substantially smaller than that of an insulation interlayer formed on the etch stop layer. Since the lower portion of the lower electrode has the substantially small inner diameter, a dielectric layer and an upper electrode formed on the lower electrode may not be efficiently formed. Thus, a leakage current may be generated. In addition, a device failure may occur. Accordingly, the reliability and yield of the semiconductor device such as a DRAM may unfortunately decrease.

SUMMARY

Example embodiments of the present invention provide methods of manufacturing capacitors having a stable structure, an enhanced reliability and improved electrical characteristics.

In one embodiment, an active region and a field region are defined on a semiconductor substrate. A first insulation interlayer is formed on the active region and the field region. A contact pad is formed through the first insulation interlayer. An etch stop layer is formed on the first insulation interlayer and the pad. A second insulation interlayer is formed on the etch stop layer. A contact hole exposing at least a portion of the pad is formed by partially etching the second insulation interlayer and the etch stop layer. A preliminary lower electrode is formed in the hole. The preliminary lower electrode is isotropically etched to form a cylindrical lower electrode in electrical communication with the contact pad. A dielectric layer is formed on the lower electrode. An upper electrode is formed on the dielectric layer.

BRIEF DESCRIPTION OF THE DRAWINGS

The above and other advantages of the present invention will become readily apparent by reference to the following detailed description when considered in conjunction with the accompanying drawings in which.

DETAILED DESCRIPTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity. Like reference numerals refer to like elements throughout.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Figure 3A:
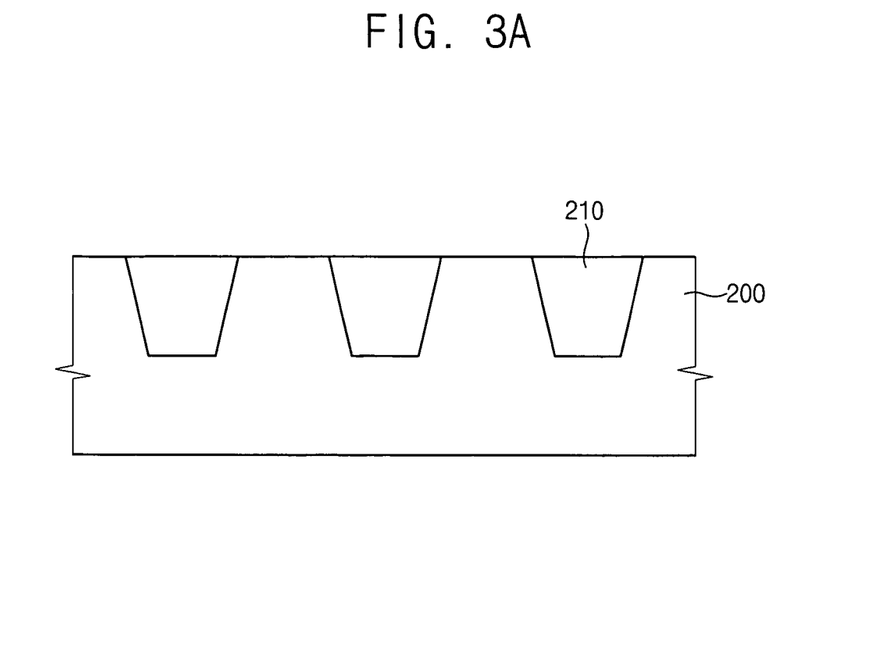
FIGS. 3A to 3G are cross-sectional views illustrating methods of manufacturing capacitors in accordance with some embodiments of the present invention.

Referring to FIG. 3A, a semiconductor substrate includes an active region 200 and a field region 210. The field region 210 may be formed by an isolation process such as a shallow trench isolation (STI) process. The field region 210 may be formed using an oxide such as silicon oxide.

Figure 3B:
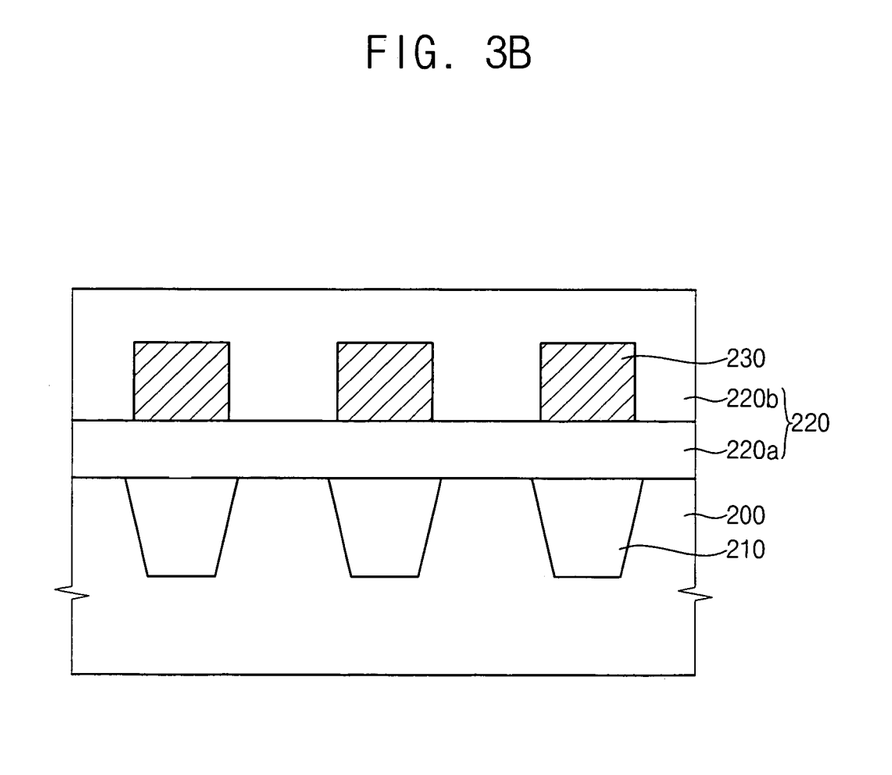

Referring to FIG. 3B, a first lower insulation interlayer 220a is formed on the field region 210 and the active region 200. The first lower insulation interlayer 220a may be formed of an oxide such as plasma enhanced tetraethylorthosilicate (PE-TEOS), boro-phosphor silicate glass (BPSG), phosphor silicate glass (PSG), high density plasma-chemical vapor deposition (HDP-CVD) oxide or undoped silicate glass (USG). These may be used alone or in a mixture thereof. The first lower insulation interlayer 220a may be formed by a sub-atmospheric chemical vapor deposition (SACVD) process, a plasma enhanced chemical vapor deposition (PECVD) process, a low pressure chemical vapor deposition (LPCVD) process or an atomic layer deposition (ALD) process.

A conductive pattern 230 is formed on the first lower insulation interlayer 220a. The conductive pattern 230 may serve as a bit line. The conductive pattern 230 may be formed using a conductive material such as a metal or a conductive metal nitride. For example, the conductive pattern 230 is formed using tungsten (W), titanium (Ti), aluminum (Al), tantalum (Ta), copper (Cu), tungsten nitride (WN), titanium nitride (TiN), aluminum nitride (AlN), titanium aluminum nitride (TiAlN), tantalum nitride (TaN), etc. These may be used alone or in a mixture thereof.

A first upper insulation interlayer 220b is formed on the first lower insulation interlayer 220a to cover the conductive pattern 230. The first upper insulation interlayer 220b is planarized by a planarization process such as a chemical mechanical polishing (CMP) process, an etch back process or a combination of CMP and etch back. Thus, a first insulation interlayer 220, which includes the first lower insulation interlayer 220a and the first upper insulation interlayer 220b, is formed on the semiconductor substrate.

Figure 3C:
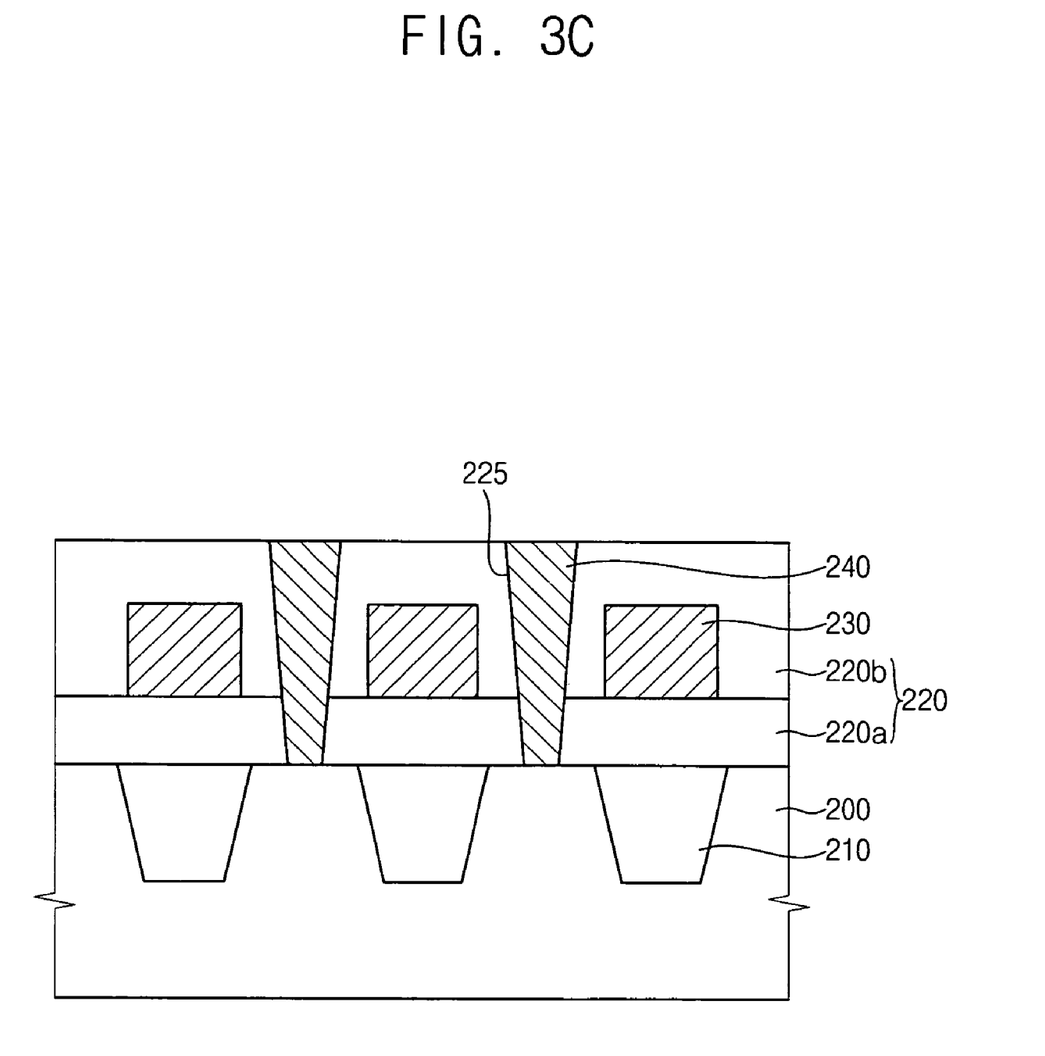

Referring to FIG. 3C, after a photoresist pattern (not shown) is formed on the first upper insulation interlayer 220b, the first upper insulation interlayer 220b and the first lower insulation interlayer 220a are partially etched using the photoresist pattern as an etching mask. Therefore, a contact hole 225 is formed through the first insulation interlayer 220.

A conductive layer (not shown) is formed on the first insulation interlayer 220 to fill the contact hole 225. The conductive layer may be formed of a conductive material such as a doped polysilicon or a metal. For example, the conductive layer may be formed using tungsten, titanium, aluminum, tantalum, etc. The conductive layer is then partially removed by a chemical mechanical polishing (CMP) process, an etch back process, or a combination of CMP and etch back until the first insulation interlayer 220 is exposed. Hence, a contact pad 240 is formed in the contact hole 225.

Figure 3D:
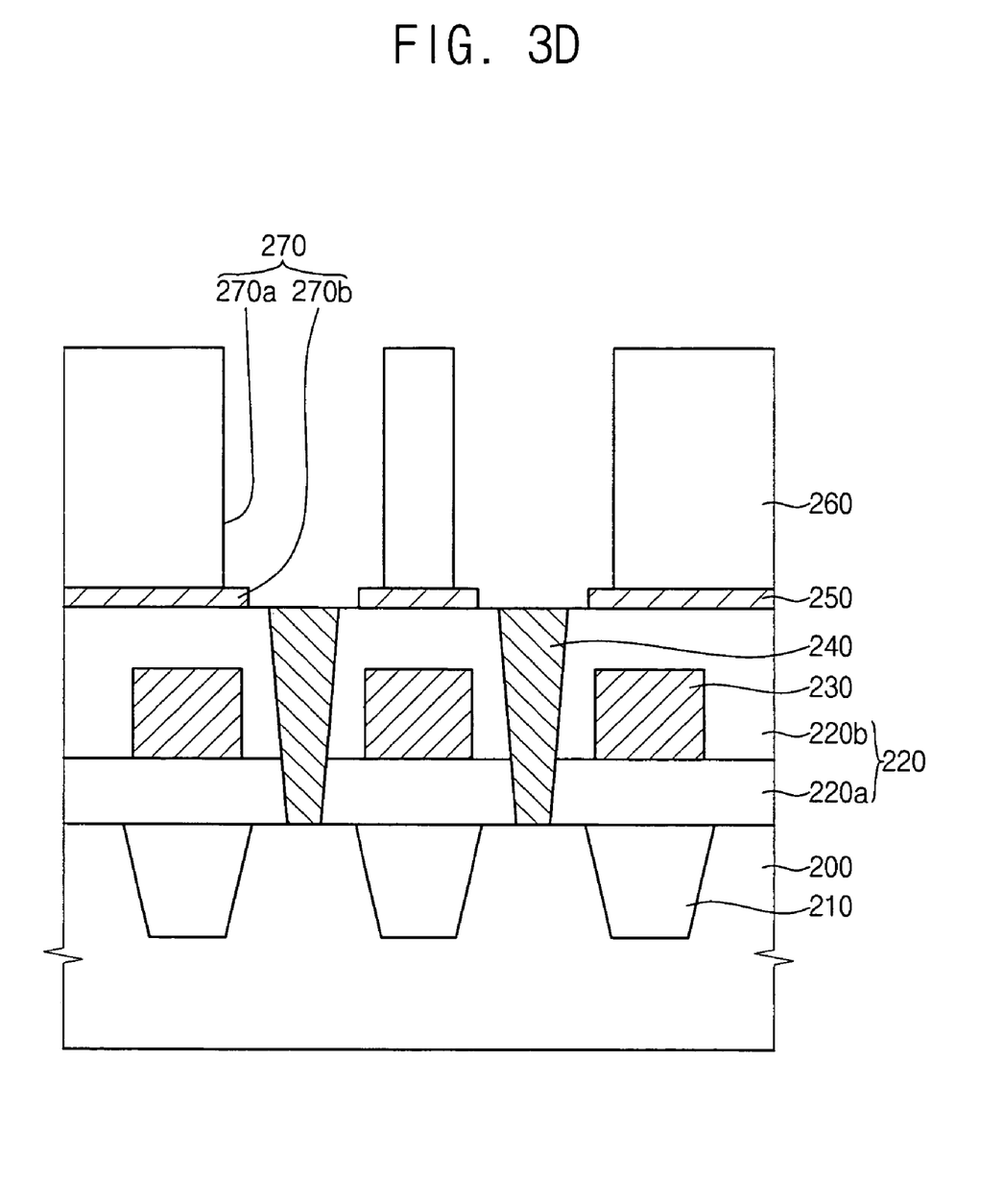

Referring to FIG. 3D, an etch stop layer 250 is formed on the contact pad 240 and the first upper insulation interlayer 220b. The etch stop layer 250 may be formed using a nitride such as silicon nitride. The etch stop layer 250 may have a thickness of about 100 to about 200 Å measured from an upper face of the first upper insulation interlayer 220b.

A second insulation interlayer 260 is formed on the etch stop layer 250. The second insulation interlayer 260 may be formed using an oxide such as silicon oxide. For example, the second insulation interlayer 260 may be formed using PE-TEOS, BPSG, PSG, HDP-CVD oxide, USG, or combinations thereof. The second insulation interlayer 260 may be formed by an SACVD process, a PECVD process, an LPCVD process, an ALD process and so on. In one example embodiment of the present invention, the second insulation interlayer 260 may be a single-layer structure that includes one layer of the oxide. In another example embodiment of the present invention, the second insulation interlayer 260 may be a double-layer structure that includes a lower layer of oxide and an upper layer of oxide. The upper layer may have an etch rate relatively lower than that of the lower layer. In still another example embodiment of the present invention, the second insulation interlayer 260 may be a triple-layer structure that includes a first layer of oxide, a second layer of oxide and a third layer of oxide. The third layer may have an etch rate relatively lower than an etch rate of the second layer, and the first layer may have an etch rate relatively higher than that of the second layer.

A capacitor may have a height generally depending on the thickness of the second insulation interlayer 260. Thus, the second insulation interlayer 260 may be referred to as a mold layer. The capacitor may have an increased height when the second insulation interlayer 260 has an increased thickness, for example, the second insulation interlayer 260 has a thickness of about 10,000 to about 20,000 Å.

The second insulation interlayer 260 and the etch stop layer 250 are partially etched by a photolithography process so that a hole 270 for a lower electrode 285 (see FIG. 3F) is formed through the second insulation interlayer 260 and the etch stop layer 250. In one example embodiment of the present invention, the second insulation interlayer 260 is partially etched to form a first opening 270a that exposes a portion of the etch stop layer 250. Then, the exposed portion of the etch stop layer 250 is partially etched to form a second opening 270b, thereby completing the hole 270 having the first and the second openings 270a and 270b. Since the second insulation interlayer 260 has an etching selectivity relative to that of the etch stop layer 250, the second opening 270b has a width substantially smaller than that of the first opening 270a.

Figure 3E:
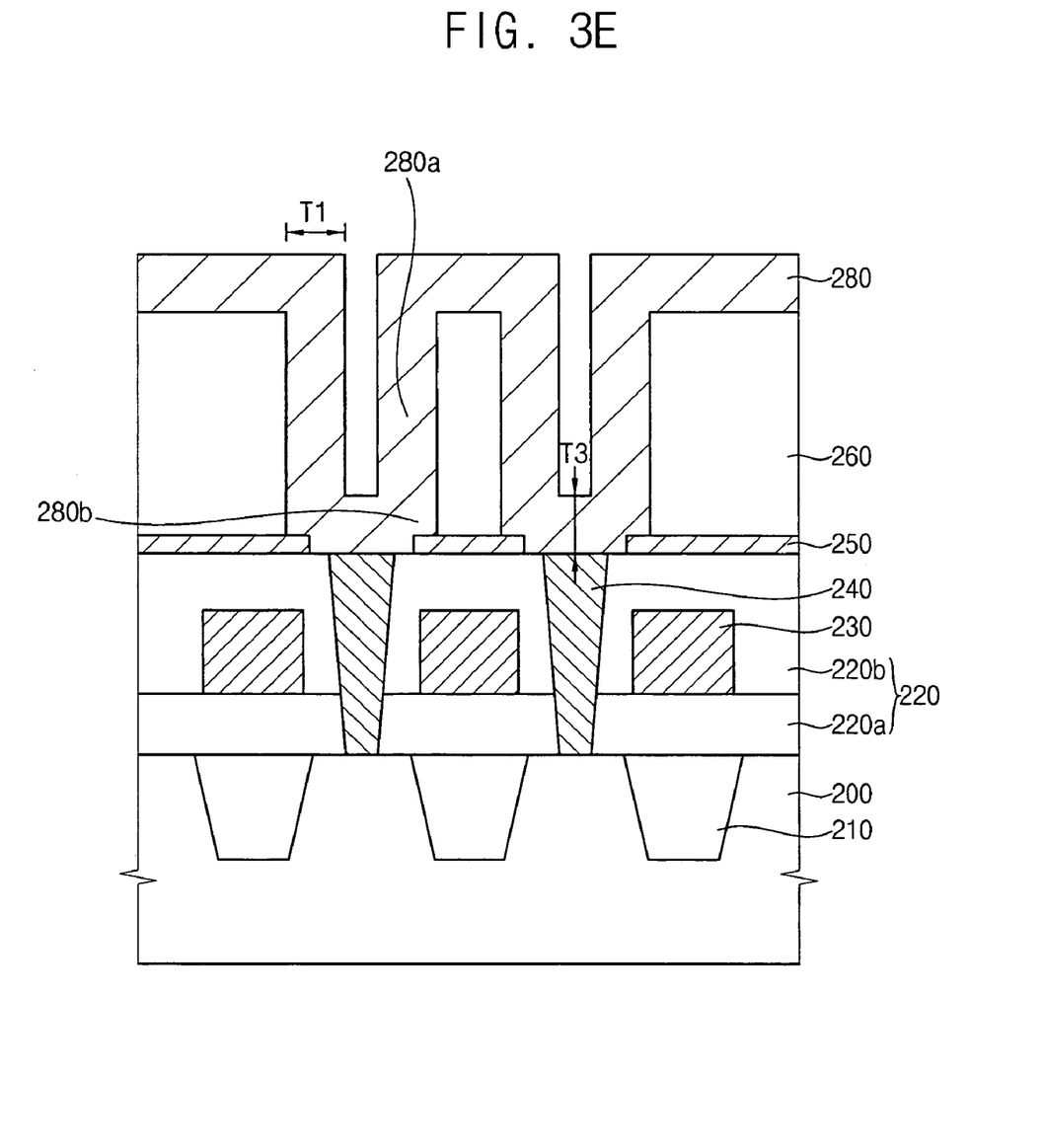

Referring to FIG. 3E, a first preliminary lower electrode 280 is formed on the second insulation interlayer 260 having the hole 270 and on the contact pad 240. Since the second opening 270b has the width substantially narrower than that of the first opening 270a, the first preliminary lower electrode 280 completely fills the second opening 270b, whereas the first preliminary lower electrode 280 partially fills the first opening 270a. The first preliminary lower electrode 280 may be formed using a conductive material such as a metal, a conductive metal nitride or polysilicon doped with impurities. For example, the first preliminary lower electrode 280 is formed using titanium, titanium nitride, tungsten, tungsten nitride, aluminum, aluminum nitride, titanium aluminum nitride, copper and so on. The first preliminary lower electrode 280 may be formed by a sputtering process, a CVD process, an ALD process, or a pulse laser deposition (PLD) process. The first preliminary lower electrode 280 may have a lateral portion 280a that has a thickness T1 substantially thicker than the thickness T2 of a lateral portion 285a of the lower electrode 285 of FIG. 3F.

Figure 3F:
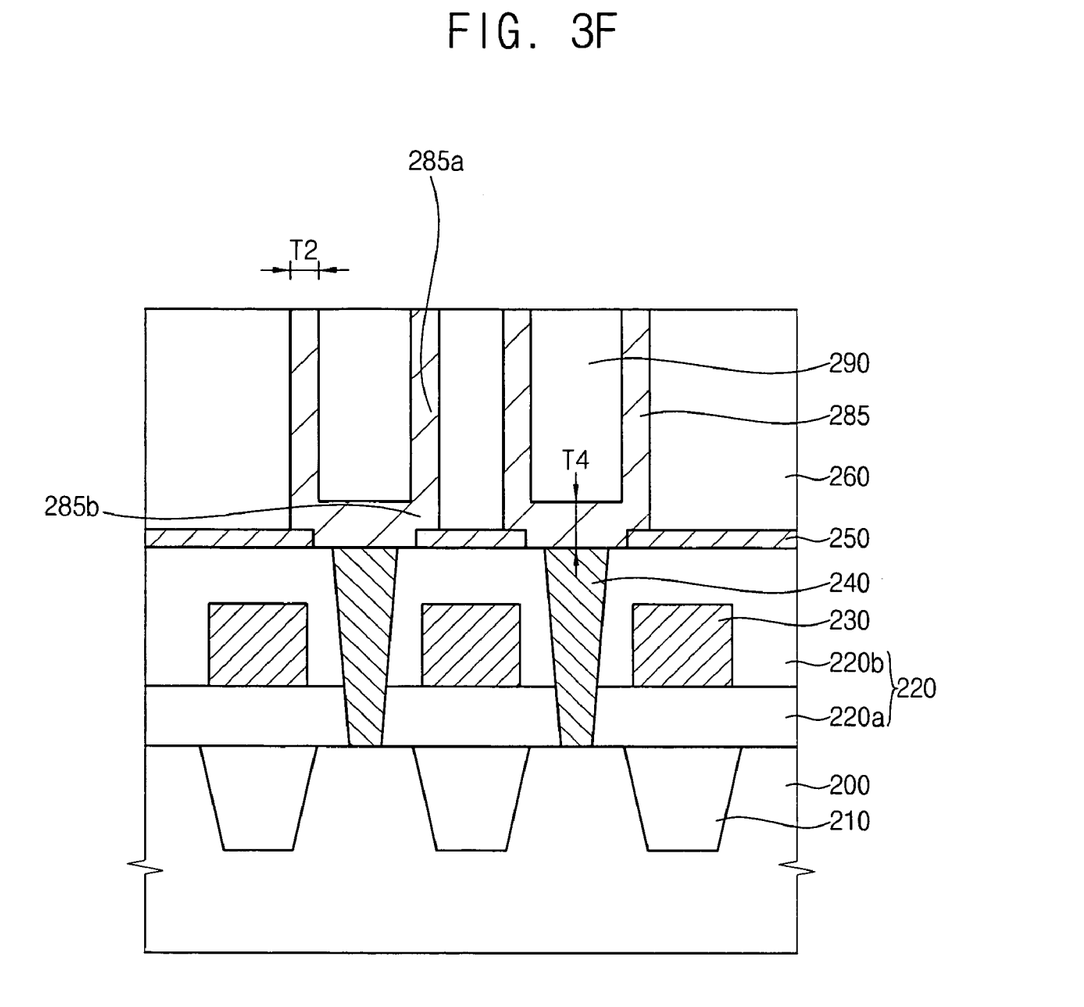

In some embodiments, the thickness T1 may be about 400 Å to about 1000 Å. The thickness T2 may be about 200 Å to about 500 Å. For example, the lateral portion 280a is about 2 times thicker than the lateral portion 285a. However, a lower portion 280b of the first preliminary lower electrode 280 may have a thickness T3 substantially identical to the thickness T4 of a lower portion 285b of the lower electrode 285.

Referring to FIG. 3F, the first preliminary lower electrode 280 is partially etched by an isotropic etching process to form a second preliminary lower electrode (not shown) in the hole 270 and on the second insulation interlayer 260. The second preliminary lower electrode is electrically connected to the pad 240. In an example embodiment of the present invention, the second preliminary lower electrode may be formed by a wet etching process. In the wet etching process, an etching solution may include a standard cleaning 1 (SC1) solution that contains an ammonia solution, a hydrogen peroxide solution and deionized water because an etch rate of the first preliminary lower electrode 280 may be easily controlled in the wet etching process. Although the first preliminary lower electrode 280 is partially etched to form the second preliminary lower electrode, the second opening 270b may continue to be completely filled with the second preliminary lower electrode.

After a sacrificial oxide layer 290 is formed on the second preliminary lower electrode to fill the first opening 270a, the sacrificial oxide layer 290 and the second preliminary lower electrode are partially removed or planarized by a CMP process, an etch back process or a combination of CMP and etch back until the second insulation interlayer 260 is exposed. Therefore, the lower electrode 285 is formed on the pad 240.

Figure 3G:
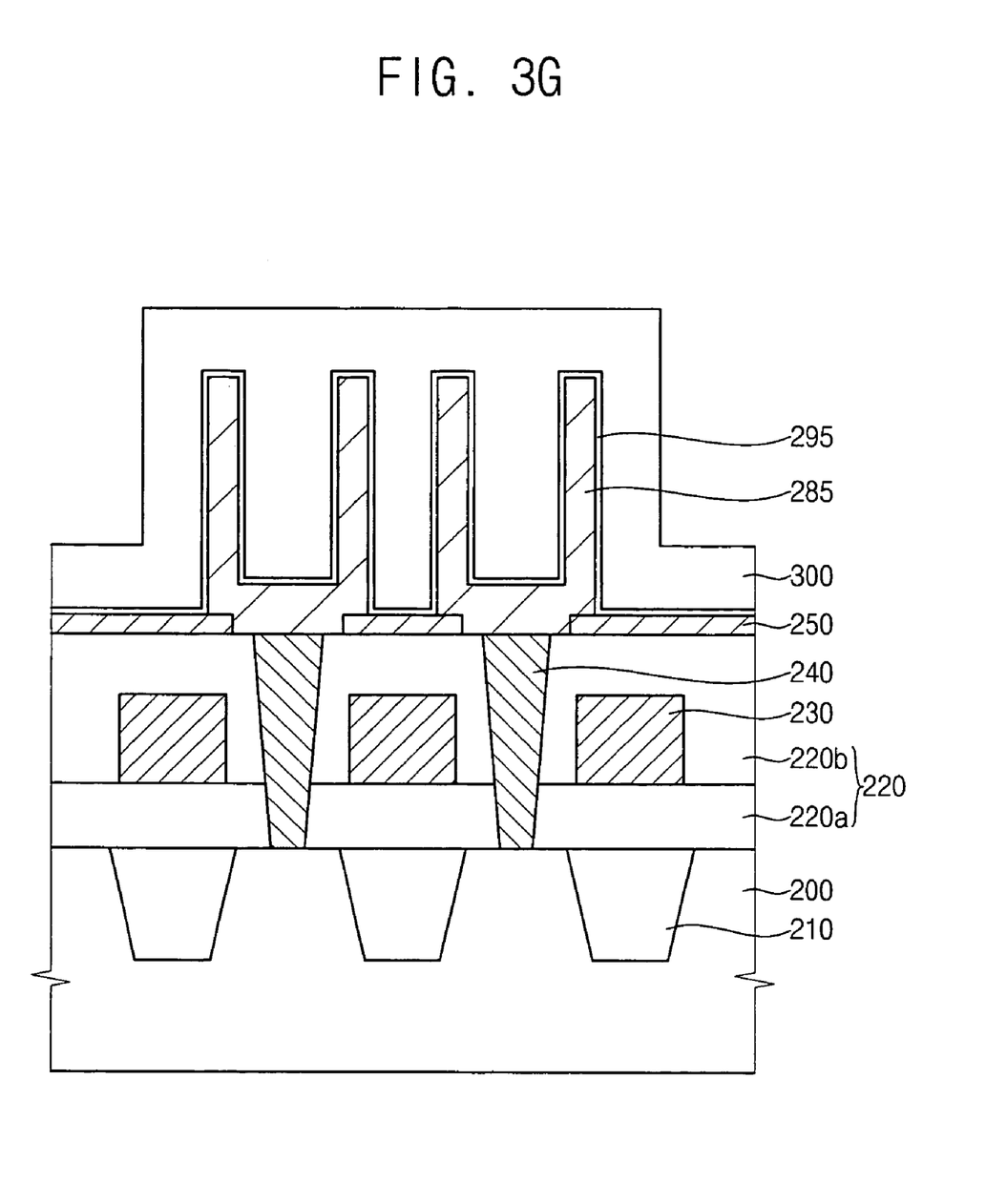

Referring to FIG. 3G, the sacrificial oxide layer 290 and the second insulation interlayer 260 are removed by an etching process using an etching solution such as an LAL solution. For example, the sacrificial oxide layer 290 and the second insulation interlayer 260 are removed using an LAL500 solution.

Since the lower portion 285b of the cylindrical lower electrode 285 has a sufficient thickness, a capacitor dielectric layer 295 and an upper electrode 300 may be stably formed on the lower electrode 285. That is, the lower portion 285b of the lower electrode 285 having a relatively large thickness may be stably supported by the contact pad 240 and the etch stop layer 250 so that the dielectric layer 295 and the upper electrode 300 having stable structures may be uniformly formed on the lower electrode 285. In addition, a leakage current may not be generated through the lower electrode 285 because the lower portion 285b of the lower electrode 285 has the large thickness.

The capacitor dielectric layer 295 may be formed on the lower electrode 285 by an ALD process, a CVD process, an HDP-CVD process and so on. The dielectric layer 295 may be formed using a metal oxide including hafnium that has a relatively large dielectric constant such as hafnium oxide or hafnium aluminum oxide. The dielectric layer 295 may have a thickness of about 30 to about 150 Å measured from an upper face of the lower electrode 285.

The upper electrode 300 may formed on the dielectric layer 295 using a conductive material such as doped polysilicon, a metal or a conductive metal nitride. In one example embodiment of the present invention, the upper electrode 300 may include a conductive material substantially identical to that of the lower electrode 285. In another example embodiment of the present invention, the upper electrode 300 may be formed using a conductive material substantially different from that of the lower electrode 285.

According to some embodiments of the present invention, the thickness of a lower portion of a cylindrical lower electrode may be sufficiently large so that a dielectric layer or an upper electrode having stable structures may be uniformly formed on the lower electrode. Additionally, a leakage current may not be generated through the lower electrode because the lower portion of the lower electrode may have the sufficiently thick thickness. Therefore, a capacitor having the lower electrode, the dielectric layer and the upper electrode may have a stable structure, an enhanced reliability and improved electrical characteristics.

When a DRAM device includes the capacitor having the lower electrode, the DRAM device may also have a stable structure, an enhanced reliability and improved electrical characteristics. Additionally, since this lower electrode may be easily formed through a simplified process, manufacturing cost and time for the DRAM device may be greatly reduced.

In addition, the present invention has been described in connection with the DRAM device. However, the principles of the present invention may be equally applied to any other semiconductor devices that include a capacitor structure.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of manufacturing a semiconductor device comprising:
    forming a first insulation interlayer on a semiconductor substrate;
    forming a contact pad extending through the first insulation interlayer;
    forming an etch stop layer on the first insulation interlayer and the contact pad;
    forming a second insulation interlayer on the etch stop layer;
    partially etching the second insulation interlayer and the etch stop layer to form a contact hole exposing at least a portion of the contact pad;
    forming a preliminary lower electrode in the contact hole;
    isotropically etching the preliminary lower electrode to form a cylindrical lower electrode in electrical communication with the contact pad;
    forming a dielectric layer on the lower electrode; and
    forming an upper electrode on the dielectric layer.

2. The method of claim 1, wherein the etch stop layer comprises nitride.

3. The method of claim 1, wherein the dielectric layer comprises a metal oxide including hafnium.

4. The method of claim 1, wherein the dielectric layer has a thickness of about 30 to about 150 Å.

5. The method of claim 1, wherein forming the dielectric layer comprises an atomic layer deposition process.

6. A method of manufacturing a semiconductor device comprising:
    forming a first insulation interlayer on a semiconductor substrate having an active region defined by a field region;
    forming a bit line on the first insulation interlayer;
    forming a contact pad through the first insulation interlayer;
    forming an etch stop layer on the first insulation interlayer and the pad;
    forming a second insulation interlayer on the etch stop layer;
    partially etching the second insulation interlayer and the etch stop layer to form a contact hole exposing at least a portion of the contact pad;
    conformally forming a conductive layer on the resulting structure having the contact hole;
    isotropically etching the conductive layer to form a lower electrode electrically connected to the pad;
    forming a dielectric layer on the lower electrode; and
    forming an upper electrode on the dielectric layer.

7. The method of claim 6, wherein the first insulation interlayer comprises a first lower insulation interlayer and a first upper insulation interlayer.

8. The method of claim 6, wherein the second insulation interlayer comprises at least two layers that have etch rates substantially different from each other.

9. The method of claim 6, wherein forming the upper electrode comprises using a metal.

10. The method of claim 1, wherein the contact hole has a first opening extending through the second insulation interlayer and a second opening extending through the etch stop layer, the first opening being substantially wider than the second opening.

11. The method of claim 10, wherein the conductive layer fully fills the second opening, whereas the conductive layer partially fills the first opening.

12. The method of claim 10, wherein isotropically etching the conductive layer comprises forming the lower electrode that fully fills the second opening.

13. A method of manufacturing a semiconductor device comprising:
    forming a cylindrical preliminary lower electrode on a semiconductor substrate, the preliminary lower electrode including a lower portion and a lateral portion extending above the lower portion, wherein the lateral portion is defined between a pair of opposing lateral sidewalls; and
    isotropically etching the preliminary lower electrode to form a lower electrode, wherein the lower electrode includes the lateral portion and wherein a thickness of the lateral portion in the preliminary lower electrode between the pair of opposing lateral sidewalls of the preliminary lower electrode is greater than a thickness of the lateral portion in the lower electrode.

14. The method of claim 13, wherein forming the lower electrode comprises a wet etching process.

15. The method of claim 13, wherein the lower electrode includes the lower portion and wherein a thickness of the lower portion in the lower electrode is substantially greater than the thickness of the lateral portion in the lower electrode.

16. The method of claim 13, wherein forming the preliminary lower electrode comprises:
    forming an etch stop layer overlying the semiconductor substrate;
    forming a mold layer on the etch stop layer;
    partially etching the mold layer and the etch stop layer to form a contact hole that has a first opening and a second opening located below the first opening substantially wider than the second opening; and forming a conductive layer in the hole, the conductive layer partially filling the first opening while fully filling the second opening.

17. The method of claim 16, wherein isotropically etching the preliminary lower electrode comprises forming the lower electrode fully filling the second opening.

18. The method of claim 1, wherein forming the preliminary lower electrode in the hole comprises forming conductive material over an upper surface of the second insulation interlayer and within the contact hole, and isotropically etching the preliminary lower electrode to form the cylindrical lower electrode comprises isotropically etching portions of the conductive material over the upper surface of the second insulation interlayer and within the contact hole.

19. The method of claim 18, further comprising removing the conductive material over the upper surface of the second insulation interlayer upon isotropically etching the preliminary lower electrode to form the cylindrical lower electrode.

20. The method of claim 13, wherein isotropically etching the preliminary lower electrode to form the lower electrode comprises isotropically etching the lower portion and the lateral portion of the preliminary lower electrode.

* * * * *